United States Patent [19]

de Ferron et al.

[11] Patent Number: 4,851,894

[45] Date of Patent: Jul. 25, 1989

[54] DEVICE FOR NEUTRALIZING THE ACCESS TO AN INTEGRATED-CIRCUIT ZONE TO BE PROTECTED

[75] Inventors: Gerard S. de Ferron, Greasque; Jean Marie Gaultier, Rousset sur Arc, both of France

[73] Assignee: Eurotechnique, Rousset, France

[21] Appl. No.: 282,957

[22] Filed: Dec. 5, 1988

Related U.S. Application Data

[63] Continuation of Ser. No. 4,223, Jan. 5, 1987, abandoned, which is a continuation of Ser. No. 763,272, Aug. 7, 1985, abandoned.

[30] Foreign Application Priority Data

Aug. 10, 1984 [FR] France .................. 84 12679

[51] Int. Cl.[4] .................. H01L 27/02; H01L 29/34; H01L 29/04
[52] U.S. Cl. .................. 357/51; 357/52; 357/59; 357/74
[58] Field of Search .................. 357/51, 52, 59, 74

[56] References Cited

U.S. PATENT DOCUMENTS

| | | | |
|---|---|---|---|
| 4,017,888 | 4/1977 | Christie et al. | 357/23.5 |
| 4,045,310 | 8/1977 | Jones et al. | 357/51 |
| 4,105,156 | 8/1978 | Dethloff | 235/441 |
| 4,210,875 | 7/1980 | Beasom | 357/51 |
| 4,268,911 | 5/1981 | Bell | 357/51 |
| 4,413,272 | 11/1983 | Mochizuki et al. | 357/51 |
| 4,434,361 | 2/1984 | Meinguss et al. | 357/84 |
| 4,446,475 | 5/1984 | Gercekci et al. | 357/84 |
| 4,628,590 | 12/1986 | Udo et al. | 357/51 |
| 4,723,155 | 2/1988 | Uchida | 357/23.5 |

FOREIGN PATENT DOCUMENTS

| | | | |
|---|---|---|---|
| 0076967 | 4/1983 | European Pat. Off. | 357/51 |
| 2503424 | 10/1982 | France . | |
| 59-66144 | 4/1984 | Japan | 357/51 |

Primary Examiner—J. Carroll
Attorney, Agent, or Firm—Oblon, Spivak, McClelland, Maier & Neustadt

[57] ABSTRACT

A device for neutralizing the access to an integrated-circuit zone to be protected. A fuse section providing a connection between an access terminal and an integrated circuit zone to be protected is connected by means of the fuse end portion located nearest the zone to be protected to a junction obtained at the intersection of a layer of a conductivity type opposite to the conductivity type in which the substrate of the integrated circuit is formed. This junction is reverse-biased during normal utilization of the circuit and forward-biased only when it is desired to melt the fuse, thus making the zone to be protected irreversibly inaccessible.

13 Claims, 1 Drawing Sheet

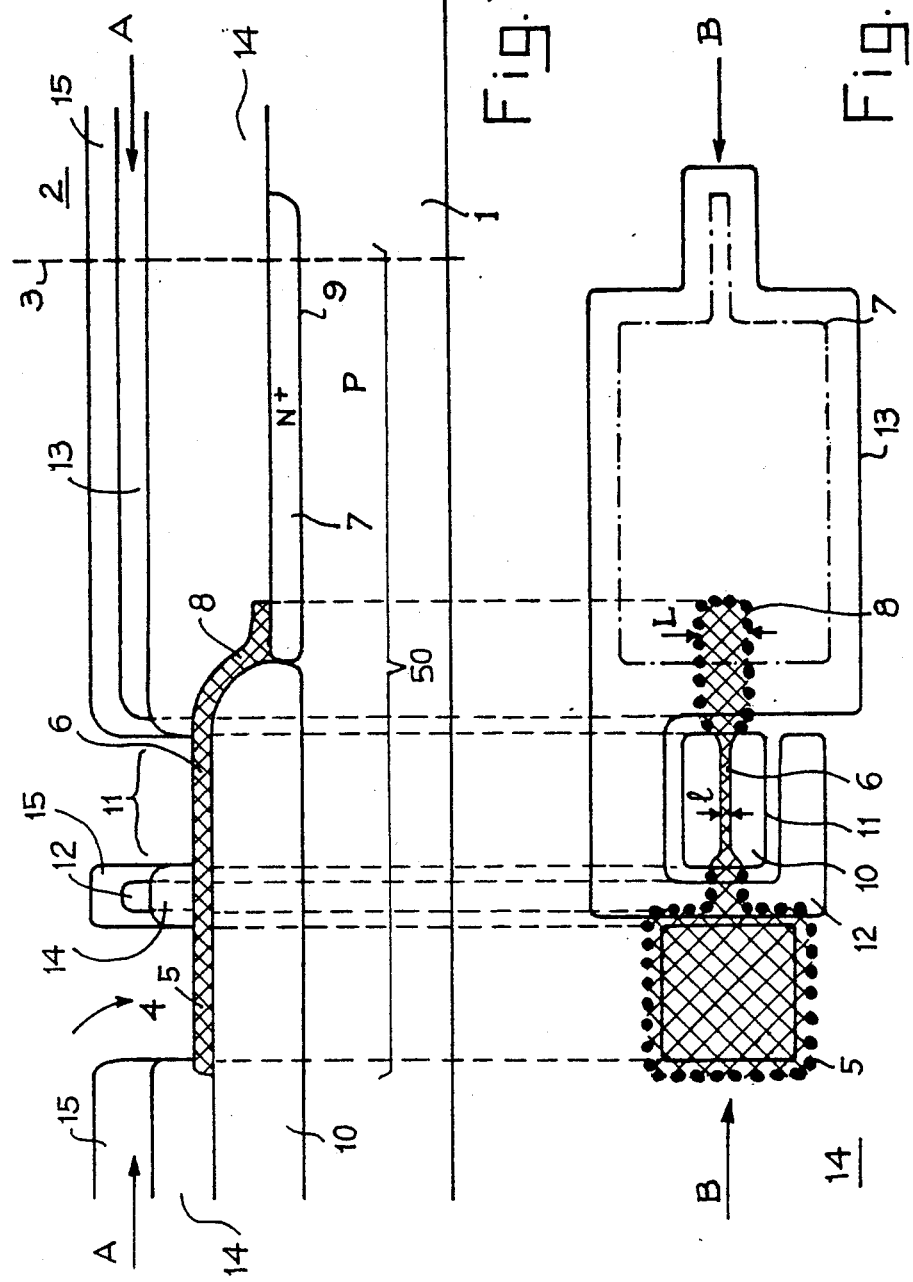

DEVICE FOR NEUTRALIZING THE ACCESS TO AN INTEGRATED-CIRCUIT ZONE TO BE PROTECTED

This application is a continuation of application Ser. No. 004,223, filed on Jan. 5, 1987, now abandoned, which is a continuation of application Ser. No. 763,272, filed Aug. 7, 1985, abandoned.

BACKGROUND OF THE INVENTION

1. Field of the Invention

This invention relates to a device for neutralizing the access to an integrated-circuit zone to be protected. The invention is particularly well-suited for use in the field of memory cards.

2. Description of the Prior Art

The field of memory cards partly covers the field of credit cards and payment cards. In a memory card, items of information relating to the identity of the card-holder, to the card-holder's secret transaction code as well as to the nature of operations which may be performed with this card are written in memory. In the application concerned, an electronic integrated circuit is employed for the fabrication of this memory and is inserted on the card. In addition, other items of information relating, for example, to the balance of a bank account may also be stored on the card if so desired. In order to guard against forgery, it is necessary to store data relating to identity, secret code, and to performable operations in such a manner as to ensure that they cannot subsequently be modified. This is not the case with a bank balance which can be modified as purchases or bank transfers are being made. Any information which is required to remain inviolable must accordingly be stored in particular zones or areas of the memory and it is thus necessary to neutralize the accesses to these areas once the useful items of information have been written therein.

In the present state of the technique, the zones to be protected are memory areas of integrated circuits. The integrated circuits considered here usually comprise a microprocessor connected to the memory. The introduction of information into the memory area to be protected is obtained by means of a set of connecting leads providing direct access to this area. Series of electrical pulses having the function of introducing the useful items of information into the memory area concerned are applied to the terminals of the integrated circuit to which said leads are connected. In order to prevent subsequent access to this zone, consideration has been given to the possibility of forming a fuse section in series. When the items of information have been entered into the memory, a strong current is passed into the connecting lead, the fuse heats-up and melts, thus simply decoupling the integrated circuit from its access terminals.

The flow of a strong current through the fuse section can obviously not take place by feeding said current into the memory since it would be liable to damage this latter. When performing a fuse-blowout operation, current is injected through a first terminal connected to one end of the fuse. This so-called injection current is shunted to a second terminal via a bypass which is connected to the other end of the fuse, namely the end which actually gives access to the memory. Although access to the memory is no longer allowed through the first terminal, this does not hold true, however, in the case of access to the memory via the second terminal which is connected to the bypass. Thus in the final analysis, no progress has been made in solving the problem since an external operator can still gain access to the memory zone to be protected via the second terminal.

SUMMARY OF THE INVENTION

The object of the present invention is to overcome the disadvantages mentioned in the foregoing by proposing an access-neutralizing device comprising a fusible portion or so-called fuse section in which one end of said fuse section is the normal terminal providing access to the memory prior to blowout of the fuse. The other end of said fuse section is so arranged that, under conditions of normal utilization of the integrated circuit, the polarity of the fuse section which is precisely conducive to introduction of data into the memory zone to be protected is opposite to its polarity during the blowout operation.

The invention relates to a device for neutralizing the access to an integrated-circuit zone to be protected, said integrated circuit being formed on a semiconductor substrate of a first given conductivity type, of the type comprising a fuse section integrated in the circuit and placed in series between said access and the zone to be protected. The distinctive feature of the invention lies in the fact that the end portion of the fuse section located nearest the zone to be protected is connected directly to a layer of a second given conductivity type forming with the substrate a junction which is reverse-biased at the time of normal utilization of said circuit.

BRIEF DESCRIPTION OF THE DRAWINGS

Other features of the invention will be more apparent upon consideration of the following description and accompanying drawings, wherein:

FIG. 1 is a view in cross-section showing a neutralizing device in accordance with the invention;

FIG. 2 is a top view of a cross-section taken along the plane A—A of FIG. 1.

The two figures represent the different layers of an integrated circuit and the same references designate the same elements. The sectional view of FIG. 1 is taken along the plane B—B of FIG. 2. Both figures represent an access to an integrated-circuit zone to be protected.

DETAILED DESCRIPTION OF THE INVENTION

The integrated circuit is formed on a semiconductor substrate 1 of a first given conductivity type. In one example, said substrate is of p-doped silicon. The region to be protected is a zone 2 located, for example, on the right-hand side of an arbitrary boundary line 3. As stated earlier, the zone 2 can comprise memory circuits which are integrated in the same substrate 1. Said zone can also comprise any other type of circuit. Regardless of the types of electronic circuit which may be formed in the zone 2 in accordance with integrated circuit technology, the aim of the invention is to neutralize the access 4 to said zone 2. The access 4 essentially comprises a terminal 5 of a connection 50. In this connection, the terminal 5 is connected to a fusible portion or so-called fuse section 6 which continues in the form of a conductive layer 7 and this latter in turn penetrates into the zone 2. The distinctive feature of the invention lies in the fact that the end portion 8 of the fuse section (namely the end portion located nearest the zone to be protected) is connected directly to the layer 7 which is of a second given conductivity type, namely N+ doped in the example under consideration. The remarkable feature here is that the layer 7 forms with the substrate 1 a junction which is conductive only in one direction. In this invention, steps are taken to ensure that this junction is conductive in a direction which is conducive to blowout of the fuse 6 but acts in opposition to the normal utilization bias of the integrated circuit.

In the example shown in the figures, the integrated circuit is fabricated in accordance with the NMOS technology. Under normal service conditions, the p-type substrate is connected to ground (that is, to zero volt) whereas other portions of the circuit are biased at +VCC. This means that the bias potential of the substrate is lower than or equal to the other bias potentials of the circuit. Now the junction 9 which forms a separation between the substrate 1 and the layer 7 is conductive only in the direction of substrate 1 to layer 7. This means that said junction is conductive only when the substrate is at a higher value of potential than the layer 7 and therefore at a value which is higher than the potential applied to the terminal 5. In consequence, when the memory is programmed, electrical pulses varying between +VCC and 0 volts are transmitted by the layer 7 to the zone 2. During this stage, the junction 9 is blocked. The layer 7 is isolated from the substrate 1 and the pulses pass correctly. In order to blow the fuse, if the substrate continues to be connected to ground, it is only necessary to supply the terminal 5 with a negative potential over a period of sufficiently long duration. In one example, this negative potential has a value of −12 volts. In this case, the junction is unblocked and the current flows to the terminal 5, thus melting the fuse 6.

It is apparent that, once this operation is completed, the layer 7 which is in conductive relation with the zone 2 to be protected can no longer be supplied with current. In point of fact, since the circuit is supplied at its normal polarity between zero volt and +VCC, the introduction of electrical pulses into the layer 7 via the substrate 1 is not possible. If this substrate is nevertheless subjected to electrical pulses, the first result thereby achieved is that the operation of the integrated circuit will be completely disorganized since the substrate is common to the entire integrated circuit. There is then no chance of obtaining any memory-programming action as originally expected. Furthermore, in the event that these electrical pulses are negative such as −VCC, for example, the junction 9 is blocked and the pulses no longer pass. If the pulses applied are positive pulses in order that they ma pass through the junction 9, it is necessary to ensure that the potential applied to the substrate 1 is higher than +VCC. This is also contrary to good performance of the circuit.

In the example shown in FIG. 1, it is observed that the access terminal 5 and the fuse section 6 are deposited above an insulating layer 10 obtained by local oxidation of the substrate 1 at this point. The insulating layer 10 can be replaced by a layer of silicon nitride ($Si_3N_{34}$) obtained by the growth process. The N+ diffusion of the layer 7 is performed, for example, at the same time as a source and drain diffusion of a normal transistor of a circuit which would be contained within the zone 2 of the integrated circuit. In consequence, this diffusion of the layer 7 does not require any additional step in the method of fabrication of the integrated circuit. That part of the connection 50 which connects the access terminal 5 to the layer 7 is formed from polycrystalline silicon having a thickness (as shown in FIG. 1) which is approximately 0.5 micron. At the point corresponding to the fuse 6, the width 1 of said polycrystalline silicon is 2.5 microns in one example. So far as the remainder is concerned, the width L of the polycrystalline silicon has a value of about 20 microns, except at the point corresponding to the terminal 5. Said polycrystalline silicon is deposited in a conventional manner after formation of the layers 10 and 7 and can even be N+doped in order to improve its contact with the layer 7. This dopant can diffuse into said layer 7 without and attendant hazard.

In FIG. 2, the contours of the polycrystalline silicon are marked in chain-dotted lines at locations in which the silicon is covered by other layers. The outstanding feature of the invention lies in the fact that, in order to achieve an improvement in melting of the fuse, the fuse is maintained in free air at the expected point of rupture. The portion which remains in the open air is designated by the reference numeral 11. In order to guard against any attempt made by an operator to connect an electrode to a remaining stump of fuse which may continue to appear in this free portion 11 in the open air after a fuse blowout, this portion of fuse is surrounded by a metal band 12. The metal of said band can be of aluminum. Said metal band 12 is joined to a metallic plate 13. This band-plate assembly is connected in addition to a constant potential (not shown). Once the fuse has melted, the layer 7 is naturally brought to a so-called rest potential by the circuits in the zone 2. The constant potential to which the band-plate assembly is connected acts in opposition to said rest potential. In particular, the plate 13 can be connected to ground. In consequence, any attempt made by an operator who is necessarily clumsy by reason of the small size of the portion 11 in free air is attended by the risk of touching the band 12 at the same time as the remaining stump of the fuse 6. This prevents any transmission of information into the zone 2 in which access is to be prohibited.

The presence of the portion 11 in free air gives rise to a potential hazard of pollution of the integrated circuit. This hazard is offset by the formation of a diffused layer 7 of substantial width. This width is also conducive to the flow of a strong current within the junction 9. However, the size of this layer 7 then becomes appreciable. In order to prevent the layer 7 itself from serving as a connection to the zone 2 to be protected, said layer is covered by the plate 13. Under these conditions, any electrode which might perforate the integrated circuit at a point located opposite to the layer 7 could not reach this latter without also touching the plate 13. This is apparent in FIG. 2 in which the contours of the diffused zone 7 are represented by a chain-dotted line within the contour of the plate 13. Since the arrangements of the metallic plate 13 and of the band 12 cannot be realized directly on the polycrystalline silicon and on the layer 7, it is accordingly necessary to separate them by means of an insulating layer. This insulating layer, which is designated by the reference 14 and appears at all points in FIG. 2 except in the free-air portion 11 and opposite to the terminal 5, is formed by depositing an oxide by low-pressure chemical vapor deposition (LPCVD).

For the purpose of finishing the integrated circuit, this circuit is usually coated with a dielectric layer 15. Said layer 15 is applied over the general surface. The free-air opening of the portion 11 is then obtained by performing a plasma etching operation on said dielectric. This plasma etch is preferred to wet-process etching. In a (chemical) wet-process etching operation, there would be an attendant danger of chemical attack on the polycrystalline silicon material of the fuse, thus resulting in a reduction in thickness. The resistance of the fuse would increase and the current flowing through the fuse at the moment of blowout would decrease, with the result that the fuse would no longer melt. It is for this reason that the insulating layer 14, which is also applied at all points and therefore in particular above the free-air portion 11 of the fuse and above the terminal 5, is maintained above said portion 11 after etching of the metallizations (in particular the metallization layer formed on the access terminal 5). Said layer 14 is even retained above the portion 11 after the cleaning operation which directly follows etching of the metallizations. The opening which provides communication between the fuse portion 11 and free air is formed last. This is a vertical opening formed by plasma attack on the layer 15 and on the layer 14. This is the only special operation which, in the method of fabrication of the integrated circuit in accordance with the invention, differs from a conventional method of fabrication of integrated circuits.

What is claimed is:

1. A device for neutralizing an access to an integrated-circuit zone to be protected, said integrated circuit being formed on a semiconductor substrate of a first given conductivity type, of the type comprising a fuse section integrated in a circuit and placed in series between said access and the zone to be protected, wherein the end portion of the fuse section located nearest the zone to be protected is connected to said zone by being connected directly to a layer of a second given conductivity type forming with the substrate a junction which is reverse-biased at the time of normal utilization of said circuit and which is forward biased at the time of the melting of the fuse the fuse section being surmounted by a metallic portion which surrounds directly a hole of said fuse section and rests on said section, electrically independent from said fuse, by means of an insulating layer, so that any attempt to contact any remaining part of said fuse after melting with a probe will be prevented by contact of said probe with said metallic portion, short circuiting said probe and preventing access to said zone, said device further comprising means for passing the melting current of the fuse through said junction, said means for passing also connecting said substrate forwardly when melting.

2. A device according claim 1, wherein said metallic portion is connected to a constant potential of the circuit in opposition to a rest potential of the layer of the second conductivity type.

3. A device according to claim 2, wherein the fuse section is open to free air by a hole in order to achieve improved melting of said fuse section.

4. A device according to claim 2, wherein the metallic portion is also connected to another metallic portion which is located above the junction.

5. A device according claim 4, wherein the fuse section is formed of polycrystalline silicon.

6. A device according to claim 5, wherein the fuse section has a width of 2.5 microns and a thickness of 0.5 micron.

7. A device according to claim 6, wherein the fuse section rests on a thick oxide layer formed above the substrate.

8. A device according to claim 6, wherein the fuse section rests on a silicon nitride layer.

9. A device according to claim 8, wherein the integrated circuit is fabricated in accordance with the MOS technology.

10. A device according to claim 9, wherein the integrated circuit is fabricated in accordance with the NMOS technology.

11. A device according to claim 10, wherein the integrated circuit is covered with a dielectric layer outside the portions which are left exposed to free air.

12. A device according to claim 2, wherein said substrate acts as a terminal of said fuse when melted.

13. A device according to claim 2, wherein said layer of a second given conductivity type extends into said zone to be protected.

* * * * *